United States Patent
Gendlin

Patent Number: 5,673,220
Date of Patent: Sep. 30, 1997

[54] MEMORY MATERIAL AND METHOD FOR ITS MANUFACTURE

[75] Inventor: Shimon Gendlin, New York, N.Y.

[73] Assignee: Kappa Numerics, Inc., Guilderland, N.Y.

[21] Appl. No.: 487,128

[22] Filed: Jun. 7, 1995

Related U.S. Application Data

[62] Division of Ser. No. 437,007, May 8, 1995, which is a continuation of Ser. No. 968,759, Oct. 30, 1992, Pat. No. 5,313,176.

[51] Int. Cl.$^6$ .................................................. H01L 43/08
[52] U.S. Cl. .......................... 365/157; 365/145; 365/117; 428/694
[58] Field of Search .............................. 365/145, 117, 365/109; 501/134; 106/287.24

[56] References Cited

U.S. PATENT DOCUMENTS

| | | | |
|---|---|---|---|
| 4,059,829 | 11/1977 | Kinsner et al. | 365/19 |
| 4,259,392 | 3/1981 | Suzuki | 428/212 |
| 4,434,429 | 2/1984 | Terao et al. | 346/135.1 |
| 4,579,594 | 4/1986 | Nanao et al. | 106/287.24 |
| 4,637,976 | 1/1987 | Terao et al. | 430/523 |
| 4,642,270 | 2/1987 | Morita et al. | 428/621 |
| 4,659,588 | 4/1987 | Yamada et al. | 427/42 |
| 4,769,311 | 9/1988 | Terao et al. | 430/348 |
| 4,839,208 | 6/1989 | Nakagawa et al. | 428/64 |
| 4,916,048 | 4/1990 | Yamada et al. | 430/523 |
| 4,935,336 | 6/1990 | Yamada et al. | 430/495 |
| 4,950,555 | 8/1990 | Michimori et al. | 428/694 |
| 4,954,379 | 9/1990 | Nishida et al. | 428/64 |
| 5,060,191 | 10/1991 | Nagasaki et al. | 365/145 |
| 5,106,714 | 4/1992 | Saha et al. | 430/106.6 |
| 5,164,349 | 11/1992 | Fujii et al. | 501/134 |
| 5,237,529 | 8/1993 | Spitzer | 365/158 |
| 5,239,504 | 8/1993 | Brady et al. | 365/157 |
| 5,271,956 | 12/1993 | Paz-Pujalt | 427/108 |
| 5,390,142 | 2/1995 | Gendlin | 365/145 |
| 5,479,384 | 12/1995 | Toth | 364/14 |
| 5,524,092 | 6/1996 | Park | 365/145 |

OTHER PUBLICATIONS

"Matrix Addressing Scheme for 3-D Polarization Echo Memory", R.Y. Hung, IBM Technical Disclosure Bulletin, vol. 18, No. 7, Dec. 1975.

"Threshold Switch Protected Ferroelectric Memory", W.R. Smith, IBM Technical Disclosure Bulletin, vol. 17, No. 12, May 1975.

"Operating Characteristics of a Thin Film Memory", Jack I. Raffel, Journal of Applied Physics, Supplement to vol. 30, No. 4, Apr. 1959.

"Magnetic Film Memory Design", J.I. Raffel et al., Proceedings of the IRE, 1961.

"Properties of Magnetic Films for Memory Systems", E.M. Bradley, Journal of Applied Physics, Supplement to vol. 33, No. 3, Mar. 1962.

(List continued on next page.)

*Primary Examiner*—Viet Q. Nguyen
*Attorney, Agent, or Firm*—Pennie & Edmonds LLP

[57] ABSTRACT

A composition of materials having ferromagnetic and piezoelectric properties is disclosed. In the preferred embodiment, the composition of materials comprises a first layer of $Pb_{(1-x-y)}Cd_xFe_y$ and a second layer of $Cr_{(1-z-w)}Zn_zTe_w$, where x, y, z and w are values within the ranges of $0.38 \leq x \leq 0.042$, $0.08 \leq y \leq 0.094$, $0.38 \leq z \leq 0.41$, $0.28 \leq w \leq 0.31$, and $0.25 \leq (1-z-w) \leq 0.32$. Additionally, each of the layers contain the elements of Bi, O and S. A random-accessible, non-volatile memory built using the invented composition of materials is also disclosed. This memory provides for storing two independent bits of binary information in a single storage cell. Each cell comprises two orthogonal address lines formed on the opposite surface of a Si substrate, a composition of materials of the present invention formed over each of the address lines, and an electrode formed over each composition of materials. The data is stored electromagnetically and retrieved as a piezoelectric voltage.

13 Claims, 15 Drawing Sheets

OTHER PUBLICATIONS

"Some Properties of an Anisotropic Thin–Film–Waffle–Iron Memory Cell:", Bobeck et al., Journal of Applied Physics, vol. 37, No. 3, Mar. 1966.

"Coupled–Film Memory Elements", Hsu Cheng, Journal of Applied Physics, vol. 38, No. 3, Mar. 1967.

"The B8500–microsecond thin–film memory", Jones et al., Fall Joint Computer Conference, 1967.

"Magnetic Film Memory Systems", Pohn et al., IEEE Transactions on Magnetics, June, 1968.

"A Critical Review of Magnetic Recording Materials", Bate et al., IEEE Transactions on Magnetics, Dec. 1969.

MEMORY MATERIAL AND METHOD FOR ITS MANUFACTURE

This application is a division of Ser. No. 08/437,007 filed May 8, 1995 which is a continuation of Ser. No. 07/968,759 filed Oct. 30, 1992 now U.S. Pat. No. 5,313,176.

BACKGROUND OF THE INVENTION

Computer technology requires memories having large storage capacity and high speed. Typically, in a modern computer, a semiconductor memory is employed as high-speed primary memory and magnetic disks are used for a large volume secondary memory.

Prior to the development of semiconductor memories, high-speed primary memory was implemented using a magnetic core memory. A magnetic core memory comprises a matrix of ring-shaped ferromagnetic cores. Each memory cell of the magnetic core memory includes a ferromagnetic core having two or more wires passing through the center of the core and a sensing coil installed around the core.

When a current I is applied to a wire that passes through the core, a magnetic field, having a magnetic field strength H which is a function of the current I is generated. The magnetic field produced by the current I causes a permanent magnetization of the core. The magnetization is measured by the magnetic induction B. The relationship between the magnetic induction B and the field strength H (i.e. a plot of B versus H) is known as a magnetization curve or BH loop. In the core memory, the magnetization curve is substantially square.

The magnetic induction B in the core has two states, $B_r$ and $-B_r$, that correspond to the opposite directions of the magnetic field. Accordingly, each core can store a bit of binary data by associating one state with a "1" and the other state with a "0", for example, $+B_r$ may be associated with a binary "1" and $-B_r$ with a binary "0".

The binary data is written into a core memory cell by applying appropriate currents to the wires. If the total current passing through the core is greater than a critical current $I_c$, the magnetic induction of the core changes from $-B_r$ to $+B_r$. Similarly, if the current is less than $-I_c$, the magnetic induction switches from $+B_r$ to $-B_r$. In an array of magnetic cores, switching is performed when polarities of currents on two or more wires coincide. Thus, if the magnetic induction of a given core is initially $-B_r$, which corresponds to a binary "0", to change the induction to $+B_r$, i.e. to store a binary "1", a current $I > I_c/2$ is applied to each of the two wires, so that the total current passing through the core is greater than $+I_c$.

The data stored in the core is retrieved by sensing the voltage across the coil induced by switching between the two magnetic states described above. The polarity of the induced voltage indicates the magnetic state of the core prior to switching.

Although the magnetic core memory described above is random accessible and non-volatile, such memory is large, consumes a large amount of power, operates at a slow speed and can not be manufactured to have a high storage density. To overcome these problems, magnetic thin film memory devices have been developed. A magnetic thin film memory consists of a strip of ferromagnetic thin film, two or more wires formed on the film for storing data and a coil around the film for retrieving data.

In the thin film memory, the magnetic moment M of the film represents the stored information. The magnetic moment M is oriented primarily in the plane of the film, and has two discrete orientations or states, namely M and −M, that represent binary "1" and "0". To store a bit of binary data, currents are applied to the wires formed on the thin film. These currents induce a magnetic field that is sufficient for changing the direction of the magnetic moment M. The stored information is retrieved by applying currents to the wires and measuring the induced voltage in the coil. As i magnetic core memory, the currents are typically selected such that a single current has insufficient amplitude to reverse the magnetic moment of the film so that at least two coincident currents are required or storing data.

There are significant drawbacks associated with magnetic thin film memory technology. First, thin film devices have an open magnetic flux structure and therefore the BH loop is smeared by a self-demagnetizing effect. To reduce this effect, the film is typically fabricated as a rectangle which length is much greater than its width. Since the induced voltage in the coil around the film is proportional to the cross-sectional area of the film, reducing the width of the film also reduces the induced voltage. As a result, the readout signal is easily affected by noise.

Second, in the existing magnetic films, the magnetic moment has a preferred in-plane direction. Thus the device is complicated by the necessity of applying currents of different amplitude for storing and retrieving data in the selected orientations. In addition, the thin film devices are not sufficiently small to achieve high storage densities.

In comparison to magnetic core and thin film memories, semiconductor memory is faster, consumes less power, and can have higher storage densities. Typical semiconductor memories include Dynamic Random Access Memory (DRAM), Static Random Access Memory (SRAM), and Read Only Memory (ROM).

DRAM offers relatively high speed, high storage density, low power consumption, and is readable and writable. However, both DRAM and SRAM are volatile, that is, they lose the stored information when the power is turned off. In addition, DRAM requires a constant refresh of the stored data which necessitates complex circuitry. While SRAM does not require a refresh, it has a higher power consumption and lower storage density than DRAM.

ROM is non-volatile but the information stored in a ROM cannot be updated, i.e., data cannot be easily written into a ROM.

In a typical disk storage system, ferromagnetic material having a substantially square BH loop is coated on a disk. A magnetic head read is provided for reading and writing information on the disk as the disk rotates past the head. The disk is divided into circular tracks. Each track is further divided into small regions in which a magnetic moment has two states that represent binary values. An external magnetic field introduced by the read/write head changes the magnetic moment of each small region so as to store a binary value in the region. Thus, to write data, the magnetic head magnetizes an adjacent small region of the rotating disk material. The stored data is retrieved in the form of a voltage induced in the head by the magnetic moment of the small region as it moves past the head.

Magnetic disk storage systems can store high volumes of data, e.g., 500 Megabytes or more. The magnetic disk storage systems, however, are not random accessible, operate at slow speed due to the requirement of mechanical movement, and require complex mechanical and electronic assemblies.

As will be apparent, none of the above-described memory technologies provides all the features that are desirable in a memory storage system. Thus, there is a present need to develop a non-volatile, high speed, high capacity, random accessible, static, and updatable storage system.

The parent application Ser. No. 07/889,025, entitled "Memory Material and Method of Its Manufacture", discloses a new composition of materials and a non-volatile, high speed, high capacity, and random accessible memory built on the basis of this composition of materials.

Specifically, in the preferred embodiment, the composition of materials disclosed in the parent application comprises sequentially formed layers of $Pb_{0.80}Cd_{0.10}Si_{0.10}$, $Se_{0.90}S_{0.10}$ and $Fe_{0.76}Cr_{0.24}$. In addition, these layers contain one or more of the following elements: Bi, Ag, O, and N. This composition of materials displays ferromagnetic, piezoelectric and electro-optical properties.

The memory disclosed in the parent application comprises two sets of parallel address lines disposed orthogonally on the opposite sides of a planar silicon substrate. The layers of the composition of materials, described above, are disposed on both sides of the substrate above the address lines such that the FeCr layers are the outermost, and each FeCr layer is connected to an electrode. In this device, each memory cell is defined by each crossing point of the address lines on the opposite sides of the substrate. Typically, in this memory device, each address line is approximately 2 μm wide and 1 μm thick, and the spacing between the adjacent lines is approximately 9 μm. Thus, each memory cell occupies an approximately 11 μm square. Each cell of this memory is capable of storing two independent bits of information. Accordingly, the storage density of the memory device disclosed in the parent application is typically about 1.65 mega bits per square centimeter.

An object of this invention is to realize a new composition of materials for building a memory with a storage density higher than provided by the memory disclosed in parent application.

SUMMARY OF THE INVENTION

According to the present invention, a new composition of materials, that exhibits ferromagnetic and piezoelectric properties and can be employed as a memory material is invented. This invention also relates to a non-volatile random accessible memory built on the basis of the invented composition of materials. A method for storing and retrieving two independent bits of information in a single cell of the memory of the present invention is also disclosed.

The composition of materials of the present invention comprises two layers of material. A first layer includes the elements of Pb, Cd, and Fe. The ratio between Pb, Cd, and Fe is $(1-x-y):x:y$, where $0 \leq x \leq 1$, $0 \leq y \leq 1$, and $0 \leq (1-x-y) \leq 1$. A second layer is formed on the first layer. The second layer includes the elements of Cr, Zn, and an element selected from the group consisting of Te and Tl (denoted by "R"). The ratio between Cr, Zn and R is $(1-z-w):z:w$, where $0 \leq z \leq 1$, $0 \leq w \leq 1$, and $0 \leq (1-z-w) \leq 1$.

In the preferred embodiment, the ratio values set forth above are within the following ranges: $0.038 \leq x \leq 0.042$, $0.08y \leq 0.094$, $0.28 \leq z \leq 0.41$, $0.28 \leq w \leq 0.31$ and $0.25 \leq (1-z-w) \leq 0.32$; and both layers also contain the elements of S, O, and Bi.

In a memory device of the present invention, two sets of parallel address lines are disposed orthogonally on the opposite sides of a planar substrate. The layers of the novel composition of materials, as described above, are disposed on both sides of the substrate above the address lines such that the second layers are the outermost, and each second layer is connected to an electrode. Each individual cell of the memory is defined by an intersection of the address lines of the two sets. The storage density of the memory is approximately eight mega bits per 1.2 cm×1.2 cm chip.

In the memory of this invention, two independent bits of information can be magnetically stored in a single memory cell. This information is retrieved as a piezoelectric voltage between the electrodes generated in response to current pulses applied to the two address lines.

More specifically, to store and retrieve a first bit of information in a memory cell, two synchronized current pulses having the same amplitude and polarity are applied to two orthogonal address lines of the memory cell. The second bit of the same cell is stored and retrieved by applying two synchronized pulses of the same amplitude but opposite polarity to the same two address lines. The current pulses employed for storing binary information are such that the amplitude of a single pulse is not sufficient to alter the state of the stored information and two concurrent pulses are necessary for storing data. To retrieve the stored information non-destructively, the combined current pulses employed for retrieving the stored information should be insufficient to alter the stored information.

The memory cell of the present invention is non-volatile, random accessible, static, operates at high speed, requires low power, is readable and writable, and can be made in high density arrays.

BRIEF DESCRIPTION OF THE DRAWINGS

These and other objects, features and advantages of the invention are more fully set forth in the accompanying Detailed Description in which.

DETAILED DESCRIPTION

The present invention relates to a new composition of materials having ferromagnetic and piezoelectric properties, and to a random accessible non-volatile memory utilizing the new composition of materials. The memory of this invention is also capable of storing two independent bits of information in each storage cell of the memory in a similar fashion to the memory disclosed in the parent application.

In accordance with the invention, the composition of materials comprises two layers of material. A first layer includes the elements of Pb, Cd, and Fe. The weight ratio between Pb, Cd, and Fe is $(1-x-y):x:y$, where $0 \leq x \leq 1$, $0 \leq y \leq 1$, and $0 \leq (1-x-y) \leq 1$. A second layer is formed on the first layer. The second layer includes the elements of Cr, Zn, and an element selected from the group consisting of Te and Tl (denoted by "R"). The weight ratio between Cr, Zn and R is $(1-z-w):z:w$, where $0 \leq z \leq 1$, $0 \leq w \leq 1$, and $0 \leq (1-z-w) \leq 1$. Preferably, the layers of the composition of materials also contain the elements of S, O, and Bi.

Hereinafter, the following notation will be used: the first layer will be referred to as $Pb_{(1-x-y)}Cd_xFe_y$ (or simply as "PbCdFe") and a second layer will be referred to as $Cr_{(1-w-z)}Zn_wTe_z$ (or simply as "CrZnTe"), and the parameters x, y, z, and w are as described above.

Note that the boundary between the two layers are not precisely defined and the elements of one layer are likely to penetrate another one. Due to the fine dimensions of the structure, the extent of intermixing of the elements of the layers has not been previously determined. Accordingly, although this discussion refers to two distinct layers, it should be emphasized that a composition of materials where the elements of the layers are substantially intermixed is within the scope of this invention.

Preferably, in the first layer, the values of x and y are within the ranges of $0.038 \leq x \leq 0.042$ and $0.08 \leq y \leq 0.094$. In the second layer, the values of w, z, and $(1-w-z)$ are preferably within the ranges of $0.34 \leq w \leq 0.45$, $0.25 \leq z \leq 0.34$ and $0.25 \leq (1-w-z) \leq 0.32$. More preferably, the values of w, z, and $(1-w-z)$ in the second layer are within the ranges of $0.38 \leq w \leq 0.41$, $0.28 \leq z \leq 0.31$ and $0.25 \leq (1-w-z) \leq 0.32$.

Figure 1:
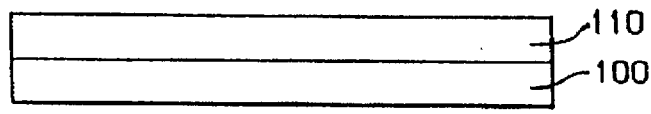
FIG. 1 shows the cross-section of a preferred embodiment of the composition of materials of the present invention.

As depicted in FIG. 1, in the preferred embodiment, the composition of materials comprises a first layer 100 ($Pb_{0.87}Cd_{0.04}Fe_{0.09}$) and a second layer 110 ($Cr_{0.3}Zn_{0.4}Te_{0.3}$). Additionally, both layers 100 and 110 are saturated with S. The proportion of S in the first layer is about 4% compared to 96% of PbCdFe and in the second layer the proportion of S is also 4% as compared to 96% of CrZnTe. In addition, both the first and the second layers are saturated with O. Both the first and second layers also contain Bi, which is provided to the layers in the proper amount according to the process described below.

In the first layer, S bonds with at least portions of Pb and Fe to form PbS and FeS, and O combines with at least a portion of Fe to form $Fe_2O_3$. In the second layer, S bonds with Zn to form ZnS. In the preferred composition of materials, both the first and second layers are saturated with S and O, and both layers display high resistivity.

Bi is present in both layers of the preferred composition of materials to improve the sensitivity of the composition to applied fields such as a magnetic field. The amount of Bi incorporated in the layers can be adjusted according to the desired sensitivity. The sensitivity increases by adding Bi to the layers. However, an excess amount of Bi makes the composition undesirable sensitive and susceptible to environmental conditions such as mechanical vibrations or temperature variations. Thus the amount of Bi in the composition is typically determined by the required sensitivity and signal-to-noise ratio.

As indicated, the composition of materials of the present invention has ferromagnetic and piezoelectric properties. Due to the ferromagnetic properties, the composition has two stable magnetic states. The preferred composition of materials is very sensitive to external fields, such as a magnetic field generated by an electrical current. For example, if a conducting wire is formed immediately below the first layer of the composition, the portion of the composition of material in the vicinity of the wire can be switched between its two stable magnetic states by applying an electrical current on the order of only nano-amperes. In addition, the switching between the two stable magnetic states generates a detectable piezoelectric voltage vertically across the layers in the order of ten micro-volts. As will be apparent, these properties are essential for realizing a high capacity, non-volatile, and random accessible memory of the present invention.

Physical properties of the invented composition of materials are described below. Understanding of these properties will help to understand the operation of the memory device of the parent invention.

By way of background, a ferromagnetic material exhibits a permanent magnetic field in the absence of an external magnetic field. Such materials can be described in terms of a large number of small magnets known as magnetic dipoles. An external magnetic field, applied to a ferromagnetic material aligns the magnetic dipoles within the material in the direction of the applied field, so that the total magnetic field within the material is the sum of the external field and the field generated by the aligned magnetic dipoles. When the influence of an external magnetic field is discontinued, the orientation of magnetic dipoles does not change, resulting in a constant magnetic field in the material. Magnetic information storage is based on this property of ferromagnetic materials.

Figure 2:
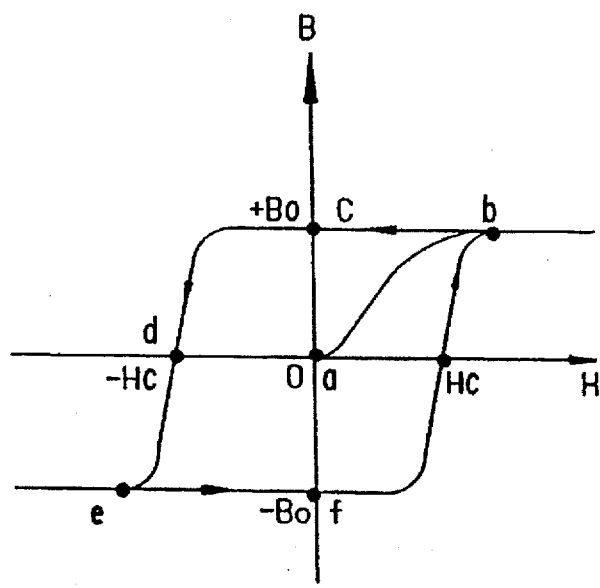
FIG. 2 illustrates the magnetization curve (BH loop) of a conventional ferromagnetic material.

FIG. 2 shows an exemplary magnetization curve of a typical ferromagnetic material. The magnetization curve is also referred to as a BH loop. The y axis in this figure represents magnetic induction B, which is an overall magnetic field in the material, and the x axis represents the magnetic field strength H of the external magnetic field. Thus, the BH loop shows the change in the magnetic induction B with changing magnetic field strength H.

Let us consider the BH loop of FIG. 2 in further detail. Assuming that initially the orientations of magnetic dipoles of the ferromagnetic material are evenly distributed in all directions, the total value of B in the absence of the external field is zero (point "a" on the curve). When an external magnetic field is applied to the ferromagnetic material, the value of B gradually increases as H increases until it reaches a point where magnetic induction B begins to saturate (point "b" on the curve). In other words, when H reaches a certain value, B remains substantially at $B_0$ even if H is being increased. If, after saturation, the external magnetic field is decreased to H=0, magnetic field induction B does not return to the point "a" (B=0). Instead, the value of B remains approximately at $B=B_0$ (point "c" on the curve).

At point "c" the direction of the external magnetic field H is reversed. At approximately $H=-H_c$, the external field H changes the polarity of the field B, and, at point "e", the field saturates at the opposite polarity $B=-B_0$.

Increasing the field strength H causes B to change from point "e" on the curve to point "f" and then "b", as illustrated in FIG. 2.

Figure 3:
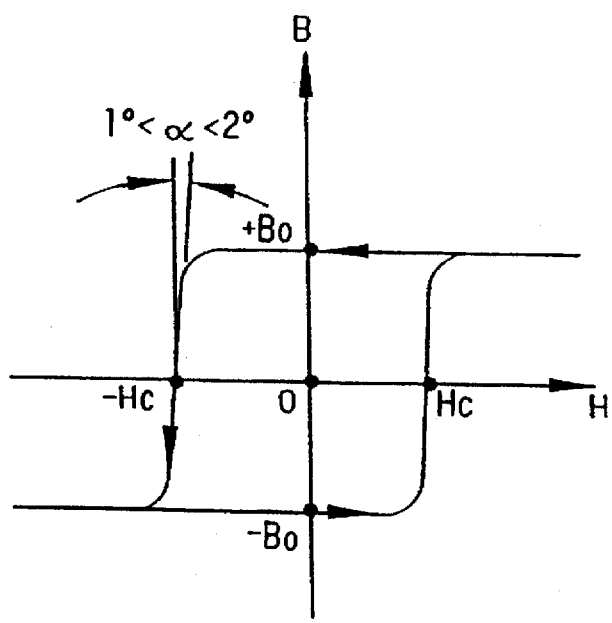
FIG. 3 shows a substantially square BH loop of the composition of materials of the present invention.

FIG. 3 illustrates the BH loop of the composition of materials of the present invention. As in FIG. 2, the x-axis indicates the external field strength H and the y axis indicates the magnetic induction B. It is important to note that for the invented composition of the materials, the shape of the BH loop is substantially square with angle α between the y-axis and the BH loop at B=0 being approximately greater than 1° but less than 2°. Because the magnetization curve is substantially square, the magnetic induction B is almost invariably at one of the two discrete, stable states, namely $+B_0$ and $-B_0$. Accordingly, the novel composition of materials is suitable for storing binary information.

As indicated, the composition of materials of the present invention also has piezoelectric properties. In general, a piezoelectric voltage is generated as a result of mechanical pressure being applied to a piezoelectric material. In the present invention, a mechanical pressure, applied to the composition of materials outwardly from within the composition so as to stretch the composition in a direction substantially perpendicular to the plane of the layers, results in a piezoelectric voltage generated across the layers. In the memory device of the present invention, the mechanical pressure is produced by a changing in the magnetic state of the composition of materials as discussed in further detail below.

Figure 4A:
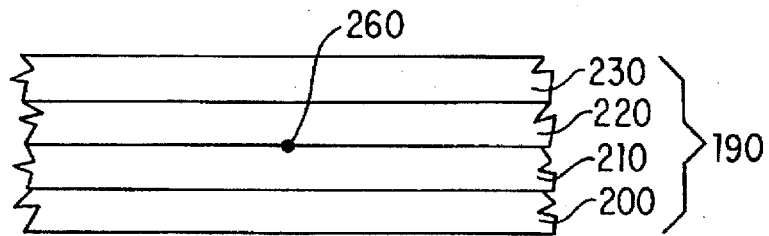
FIGS. 4 (a)–(h) illustrate the process of generating piezoelectric voltage in the composition of materials.

To aid in understanding the piezoelectrical properties of the composition of materials, an illustrative structure is shown in FIG. 4(a). The properties of the composition of materials are explained in conjunction with FIGS. 4(b)–(h).

FIG. 4(a) illustrates a structure 190 comprising two layers of the composition of materials of the present invention. Specifically, the structure comprises a first PbCdFe layer 220, a first CrZnTe layer 230, a second PbCdFe layer 210, a second CrZnTe layer 200. In addition, all the layers also contain S, O, and Bi. A wire 260 runs parallel to the layer through the middle of the structure (i.e. between two compositions of materials).

Figure 4B:
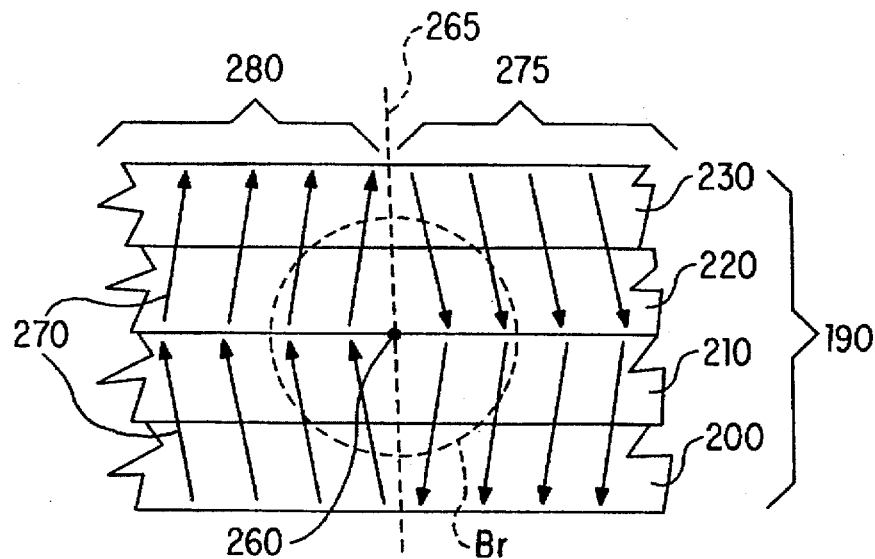
Figure 4C:
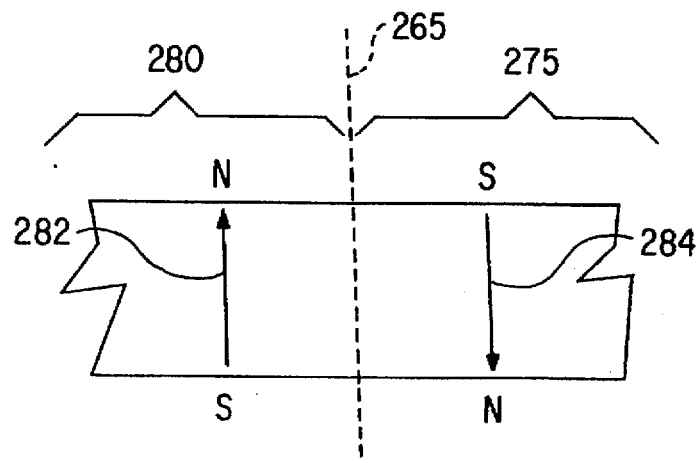

As shown in FIG. 4(b), an electrical current applied to wire 260 in a direction pointing down onto the page generates a substantially circular magnetic field around the wire (indicated by a circle $B_r$) in the clockwise direction (indicated by the arrow). Arrows 270 illustrate the directions of the magnetic dipoles in the layers under the influence of this external field. At this point, the structure can be viewed as divided into two sections 275, 280 that are symmetric about a vertical axis 265 perpendicular to wire 260 as shown in FIG. 4(b). The dipole arrangement in the sections 275, 280 is equivalent to two magnets of the same strength having north and south poles as indicated by arrows 282 and 284 in FIG. 4(c). The length of each arrow represents the amplitude of the magnetic induction B of the corresponding magnet. Due to the attraction between the South pole S and the North pole N of each magnet, the structure is mechanically compressed in the direction perpendicular to the layers of the structure.

Figure 4D:
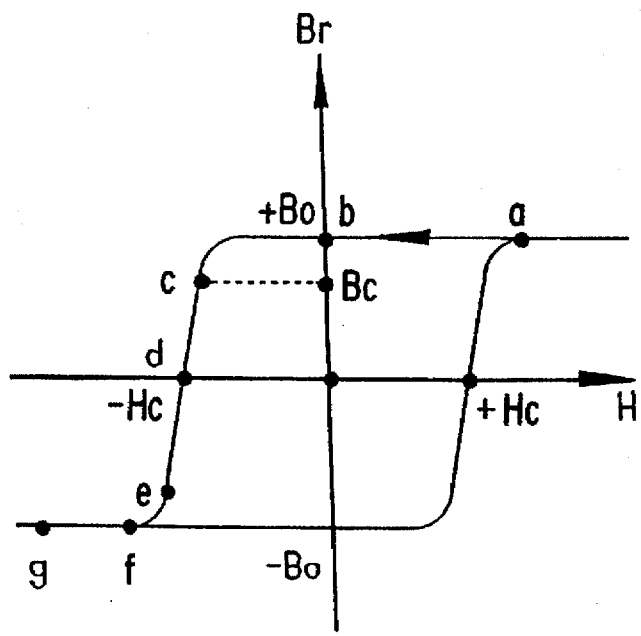

The BH loop of the magnetic induction $B_r$ is shown in FIG. 4(d). As described previously the BH loop is substantially square, exhibiting two discrete, stable magnetic states, $+B_0$ and $-B_0$.

Additionally, the magnetic field has a critical field strength $H_c$ which is defined as the amplitude of the magnetic field strength that causes switching between $+B_0$ and $-B_0$. Consequently, if H is greater than $H_c$, the magnetic induction $B_r$ has a value $+B_0$. If H is less than $-H_c$, $B_r$ has a value $-B_0$.

Assume that initially under the influence of the applied external field, the magnetic state is described by point "a" on the curve of FIG. 4(d), where the induction is $+B_0$. To change the magnetic state of the composition of materials from $+B_0$ to $-B_0$, the current passing through wire 260 must be reduced to reduce the magnetic field strength H. When the current is zero the magnetic strength H is also zero (point "b" on the BH loop). As noted, due to its ferromagnetic properties, even without the external field, the magnetic state of the storage media remains at $B_0$, i.e., the information represented by the magnetic induction $B_0$ is retained.

Figure 4E:
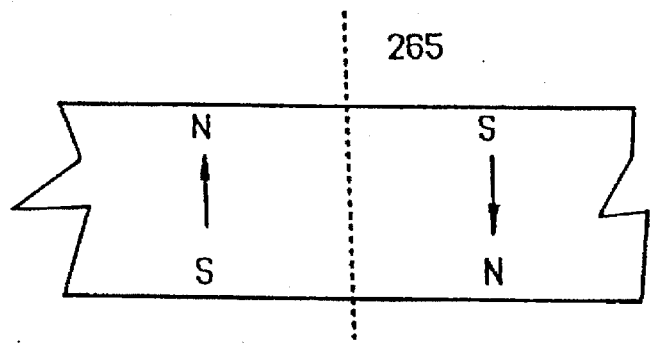

When the direction of the current is reversed, the magnetic field strength continues to decrease. At point "c", the magnetic induction B reaches the value $B_c$, which is less than $B_0$. At this point, the dipole moment has been reduced, as shown in FIG. 4(e), because the dipoles began to realign in the opposite direction. Accordingly, the mechanical pressure on the layers due to the attraction of the FeCr layers 200, 250 has been reduced. The change in the pressure on the layers causes piezoelectric voltage to be generated perpendicularly across the layers. At point "d", where H=$-H_c$ and the magnetic induction B is zero, the pressure applied to the layers is minimal because the dipoles are aligned in different directions. At this point, the induced piezoelectric voltage reaches its maximum value, due to the maximum change in the pressure on the layers.

Figure 4F:
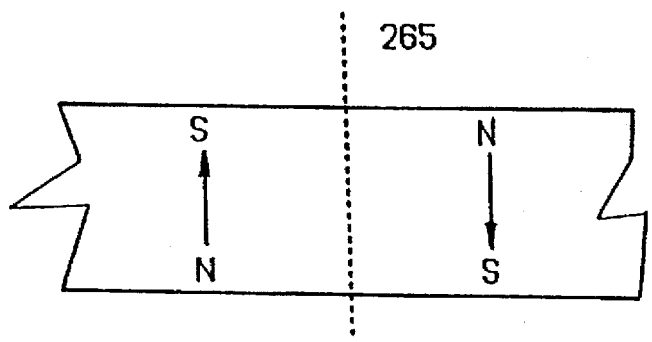

As H continues to decrease below $-H_c$, the magnetic state switches from point "d" to the point "e" and then to point "f" where it reaches the second stable state B=$-B_0$. FIG. 4(f) shows that at point "f" the poles of the magnets have been reversed. Thus, at point "f", the mechanical pressure on the layer returns to its initial value, reducing the piezoelectric voltage. Increasing the reversed current further (from point "f" to point "g") does not increase the magnitude of the dipole moment and therefore does not increase mechanical pressure on the layers.

Figure 4G:
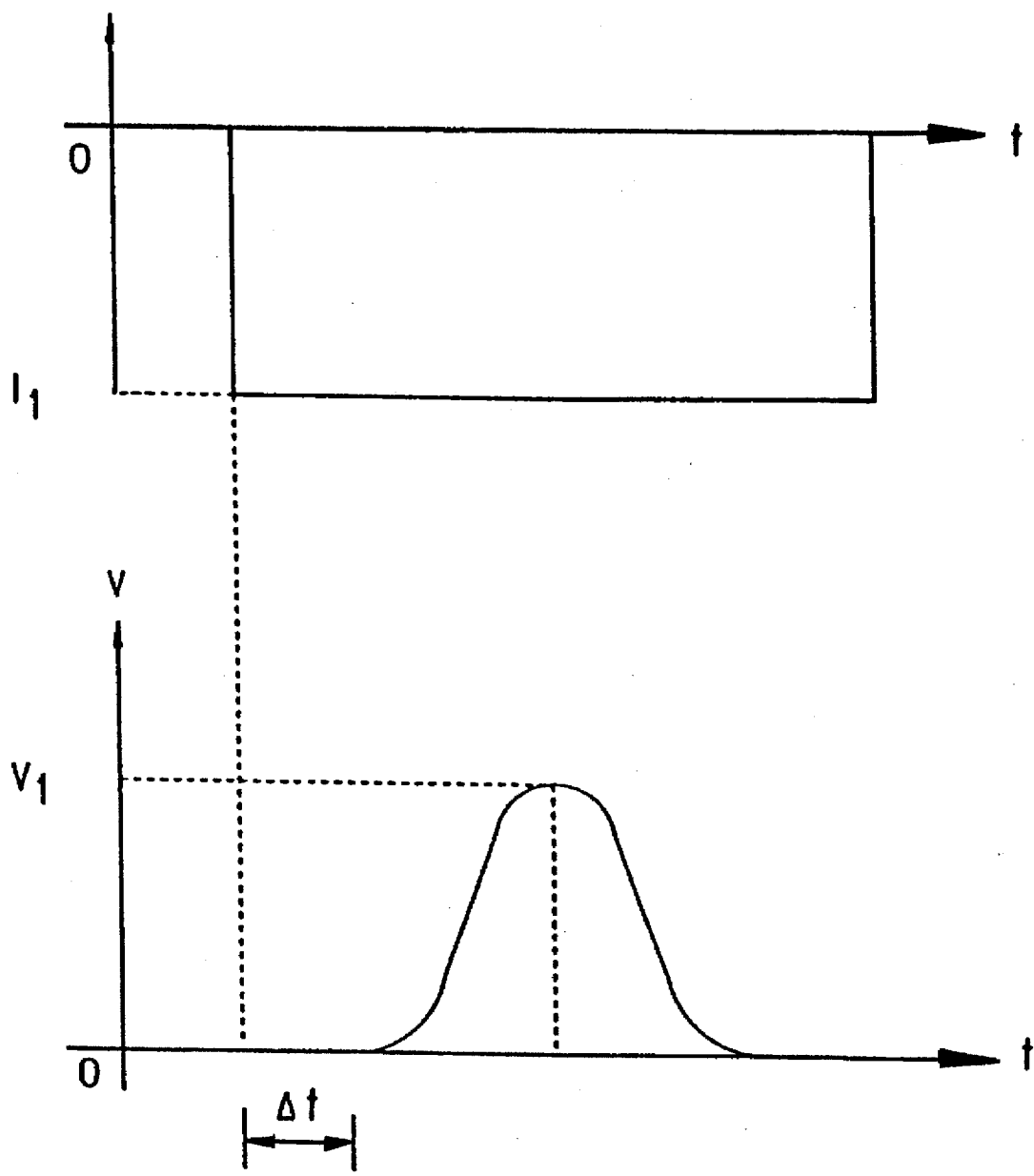

In FIG. 4(g), the piezoelectric voltage generated in response to a current pulse is illustrated in the time domain. As illustrated, a piezoelectric voltage pulse is delayed from the time of the application of the current pulse. Note that the amplitude of the current pulse applied to the wire (−I) should be sufficient to switch $B_0$ to $-B_0$. Similarly, Switching from the magnetic state $-B_0$ to $+B_0$ also generates a piezoelectric voltage pulse.

As indicated in FIG. 4(d), a current that generates a field having an amplitude greater than $H_c$ is required for switching between the magnetic states. If, however, a current of a lesser amplitude causes B to assume a value indicated by point "c" in FIG. 4(e). At this point, the magnetic state is unstable. In such a case, the magnetic induction B tends to oscillate between the values of $B_0$ (point "b") and $B_c$ (point "c"). The amplitude $V_2$ of this piezoelectric voltage pulse is smaller than the amplitude of the pulse generated as a result of switching from $+B_0$ to $-B_0$.

Figure 4H:
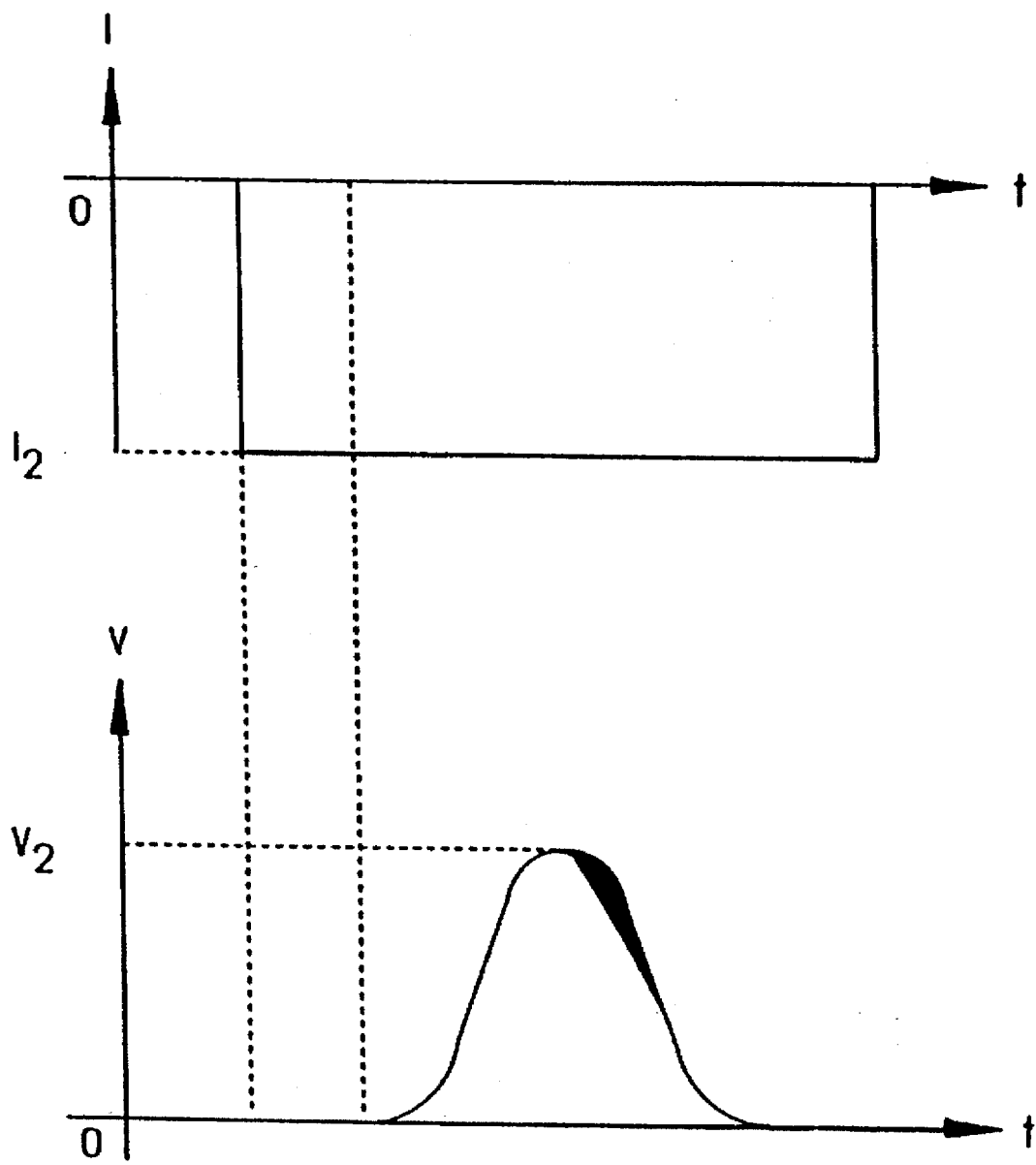

FIG. 4(h) shows a current pulse I which causes B to assume the value $B_c$. The piezoelectric voltage pulse, generated in response to this current is shown in the lower portion of the figure. The shaded area reflects the oscillation between the two states ($B_c$ and $+B_0$), as it would be observed on an oscilloscope. As described subsequently, the piezoelectric voltage generated in response to the current that disturbs but does not switch the magnetic states, can be employed for reading magnetically stored information.

Figure 5A:
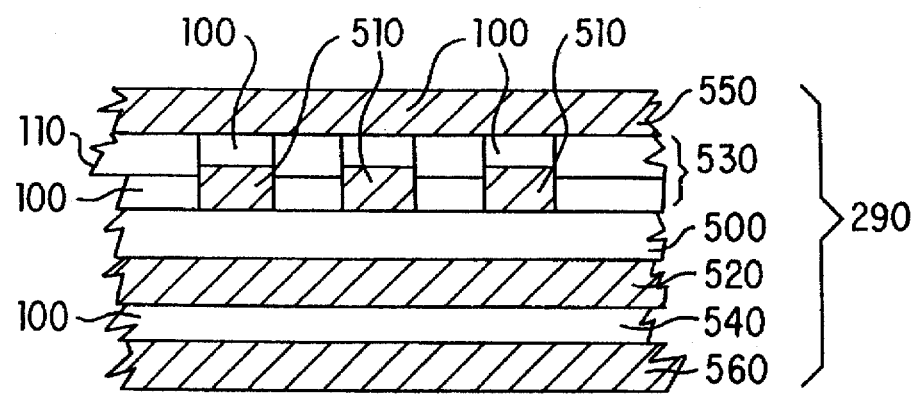
FIGS. 5(a) and (b) are the cross section and top-view of the preferred embodiment of the memory device of the invention.

FIGS. 5(a) and (b) illustrate the cross-section (not to scale) and the top-view of the preferred embodiment of a portion of the memory device 290 of the present invention. The memory device comprises a silicon planar substrate 500, first address lines 510 formed on one surface of the substrate, and second address lines 520 orthogonal to the first lines formed on the opposite surface of the substrate. A first 530 and a second 540 of the composition of materials of the present invention are disposed on the opposite sides of the substrate over the address lines. Electrodes 550, 560 are connected to the compositions of materials 530, 540 respectively. Note that, in the composition of materials 530 and 540, the portion located between the address lines comprise both layer 100 of PbCdFe and layer 110 of CrZnTe. However, only the CrZnTe layer 100 is present above the address lines.

The first and second address lines are silver strips approximately 1 μm wide and approximately 1 μm thick. The spacing between the adjacent address lines is approximately 4.75 μm. Each composition of materials 530 and 540 comprises the first layer and the second layer of the present invention described above. The first and second layers of 530 and 540 are sequentially formed on the Si substrate with the two second layers being the outermost on both sides of the substrate. Preferably, each layer is approximately 0.7 μm thick so that each combination of materials 530 and 540 is approximately 1.4 μm thick. The substrate is approximately 140 μm thick and the electrodes are about 1 μm thick silver layers formed on the second layers of 530 and 540.

In the memory device of the present invention, the intersection and its neighboring area of the first and second address lines, formed on the opposite sides of the substrate, constitute a single storage cell. As in the memory disclosed in the parent application, each storage cell of the memory of the present invention is also capable of storing two independent bits of binary information. Given the dimensions of the address lines and the spacing between them, the storage density of the memory of the present invention is approximately eight mega bits per 1.2 cm×1.2 cm chip.

Next the fabrication of the combination of materials and memory device of the present invention are described. Preferably, the fabrication takes place in a class 100 clean room environment.

Figure 6:
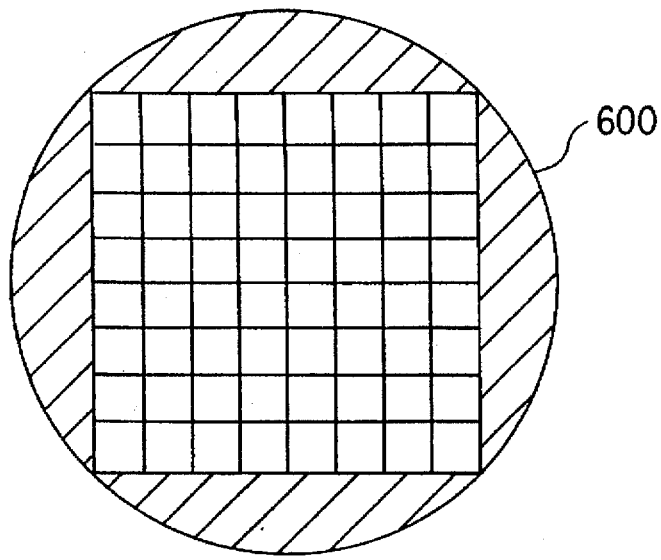
FIG. 6 depicts a top view of address lines formed on a substrate.

The fabrication of the memory device begins with building the first and second address lines onto a substrate. First, approximately 1 μm thick silver layers are deposited onto the opposite surfaces of a silicon planar substrate which is approximately 150 μm thick and three inches in diameter. Alternatively, other materials having low electrical resistivity, such as gold, aluminum or platinum, can be used instead of silver to form the address lines. The deposition of the silver layer is conducted by a conventional technique such as thermal evaporation, e-beam evaporation, or sputtering. The deposited silver layers are then photolithographically patterned and etched to form a series of metal strips, each having a width of approximately 1 μm and the series of strips on one side of the substrate being orthogonal to the strips on the opposite side so that the strips on both sides of the substrate form a cross-barred structure. The top view of the substrate after this step is depicted in FIG. 6 where the stripes are formed in the centered square portion of a circular silicon substrate 600 which is approximately three inches in diameter. Preferably, after this step, the silver layers outside the square that contains the strips remain unetched so that the ends of all the strips are connected in this peripheral region of the wafer.

For convenience, the term "wafer" is used hereinafter to refer to the substrate together with various structures built upon the substrate at various steps during the fabrication process.

The next step is to deposit a thin layer of sulfur (S) onto both sides of the wafer with address lines formed on its two surfaces. Sulfur is deposited by exposing the substrate to sulfur vapor in a sealed chamber. The chamber has an air-tight partition dividing the chamber into upper and lower portions. Prior to the deposition of sulfur, the wafer is placed in the upper portion of the chamber and a desired amount of sulfur is placed in the low portion. Then, the sulfur is heated to 450° to 500° C. so that sulfur vapor is formed in the lower portion of the chamber. Next, the partition is removed and sulfur vapor is introduced into the upper chamber. The wafer is then exposed to the sulfur vapor for about one minute. As a result, a layer of sulfur is formed on each surface of the wafer. Note that the exact thickness of sulfur formed on the wafer is not important as long as the amount of sulfur is sufficient to saturate the subsequently deposited layers.

Following the deposition of sulfur, layers $Pb_{0.87}Cd_{0.04}Fe_{0.09}$ and $Cr_{0.3}Zn_{0.4}Te_{0.3}$ are deposited sequentially onto both sides of the wafer. Prior to the deposition, a deposition source for each layer is prepared to contain the proper amount of components of each layer according to the ratios specified above.

Specifically, the deposition source is prepared by first mixing together proper amounts of powder of each required element to form a mixture. The typical size of particles in the powders of each element is about 2 μm. Following the mixing, the mixture is pressed and baked to form the desired shape and dimensions. For example, for the deposition of layer $Pb_{0.87}Cd_{0.04}Fe_{0.09}$, powders of Pb, Cd and Fe are mixed in the proportions of 87:4:9. After the powders of Pb, Cd, and Fe are well mixed, the mixture is pressed in a mold to form a 1.5×1.5×1.5 cm³ cube. Typical pressure applied to form the cube is between 1.5 and 2.0 tons. When the pressure is removed, the cube remains in the mold where it is heated to a temperature between 450° and 500° C. using a microwave source. The temperature reaches 450° to 500° C. in about one to two seconds. Thereafter, the heat is turned off and the cube is left in the mold to cool down to room temperature in the room temperature environment. In the preferred embodiment, the same system is employed for pressing the mixture of powders in a mold and for heating it to the temperature specified above. Such system which integrates pressing and heating are known in the art. A cube for depositing $Cr_{0.3}Zn_{0.4}Te_{0.3}$ layer is formed in the same fashion.

To reduce the grain size of the materials in the cubes, the cube for $Pb_{0.87}Cd_{0.04}Fe_{0.09}$ is then immersed in liquid oxygen and the cube for $Cr_{0.3}Zn_{0.4}Te_{0.3}$ is immersed in liquid nitrogen for about three hours. Thereafter, the cubes are removed from the liquid nitrogen or liquid oxygen and are placed in the room temperature environment to warm up to room temperature.

Next, each cube is employed for depositing the respective layer. The cubes are referred to as a deposition source for the corresponding layer. The $Pb_{0.87}Cd_{0.04}Fe_{0.09}$ and $Cr_{0.3}Zn_{0.4}Te_{0.3}$ layers are then sequentially deposited onto both sides of the substrate. The deposition can be accomplished using well-known methods. For example, in the preferred embodiment, a conventional plasma sputtering techniques is used. The sputtering is performed in a vacuum chamber utilizing Ar gas. In the vacuum chamber, the deposition source is placed at a distance above the center of the wafer. During the deposition of each layer, the temperature of the wafer is not controlled, however, it has been estimated that the temperature varies approximately between 90° and 220° C.

As described previously, prior to the deposition of the $Pb_{0.87}Cd_{0.04}Fe_{0.09}$ and $Cr_{0.3}Zn_{0.4}Te_{0.3}$ layers, the wafer has been covered with a thin layer of sulfur. During the deposition of $Pb_{0.87}Cd_{0.04}Fe_{0.09}$ and $Cr_{0.3}Zn_{0.4}Te_{0.3}$ layers, sulfur diffuses into and reacts with the deposited materials. As a result, after the deposition, both $Pb_{0.87}Cd_{0.04}Fe_{0.09}$ and $Cr_{0.3}Zn_{0.4}Te_{0.3}$ layers are KS saturated with sulfur, forming PbS and FeS in the first layer and ZnS in the second layer. The concentration of sulfur in both layers has been estimated to be 4% of weight compared to about 96% of Pb, Cd, and Fe combined in the first layer and 96% of Cr, Zn, and Te combined in the second layer.

Figure 7A:
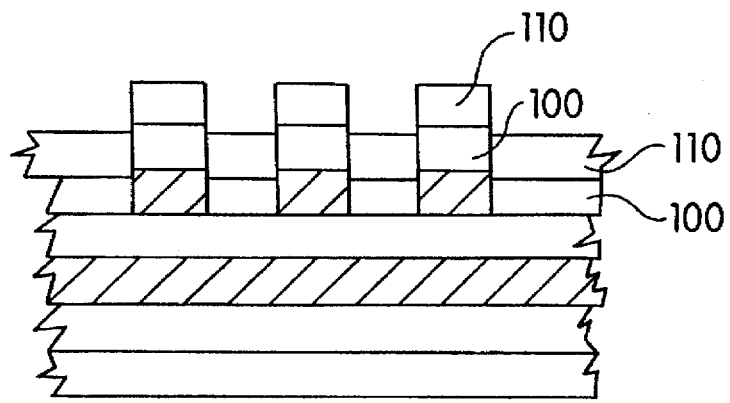
FIG. 7(a) and (b) illustrates the cross section of a wafer, before and after polishing.

During the deposition, a thickness sensor in the chamber is utilized to detect the thickness of the deposited layers. As indicated, each $Pb_{0.87}Cd_{0.04}Fe_{0.09}$ and $Cr_{0.3}Zn_{0.4}Te_{0.3}$ layer should be approximately 0.7 µm thick, forming two structures, each approximately 1.4 µm thick, on the opposite surfaces of the wafer with the two $Cr_{0.3}Zn_{0.4}Te_{0.3}$ layers being the outermost. FIG. 7(a) illustrates the cross-sectional view of the wafer after this step. Since the silver address lines are 1 µm thick, the total thickness of the materials above the surfaces of the silicon substrate is 2.4 µm in the areas having the silver address lines and 1.4 µm in the areas between the silver address lines.

Figure 7B:
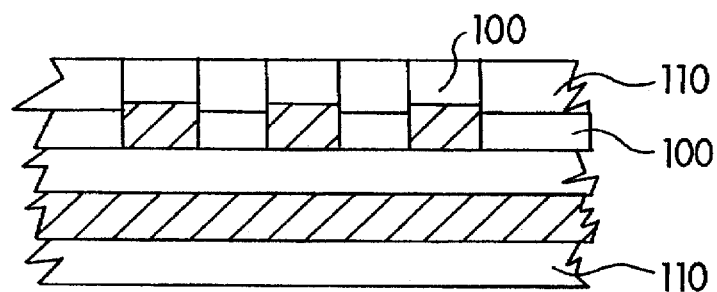

Both sides of the resultant structure are then polished to create smooth and planar surfaces such that the total thickness of materials deposited on both sides of the wafer is approximately 1.4 µm. As illustrated in FIG. 7(b), after polishing, the deposited materials between the address lines include both $Pb_{0.87}Cd_{0.04}Fe_{0.09}$ and $Cr_{0.3}Zn_{0.4}Te_{0.03}$ layers and remain approximately 1.4 µm thick. The deposited materials above the address line has been reduced to 0.4 µm thick, and consist of essentially $Pb_{0.87}Cd_{0.04}Fe_{0.09}$ layer.

Thereafter, Bi and O are added to the layers by an electrochemical process that employs heated water containing $Bi_2O_3$. Specifically, high purity water is first heated to approximately 97° C. in a stainless steel container with a continuously stirring device on the bottom of the container. $Bi_2O_3$ powder is then added to the heated water. Preferably, the weight of $Bi_2O_3$ powder is about 4–6% and the weight of water is about 94–96%.

Prior to the electrochemical process, the address lines on both sides of the substrates should be connected to a single electrode. Recall that in the preferred embodiment, the address lines are etched such that the lines on each side are connected around the perimeter of the wafer. The substrate is then immersed in the water containing $Bi_2O_3$ powder. The water containing $Bi_2O_3$ powder is maintained at a temperature of 97° C. and is continuously stirred. A voltage having specific characteristics described below is then applied between the container and the electrode that is connected to all the address lines. Under the influence of the applied voltage, Bi and O diffuse into the deposited layers. As a result, Bi and O are incorporated into the deposited materials.

Figure 8A:
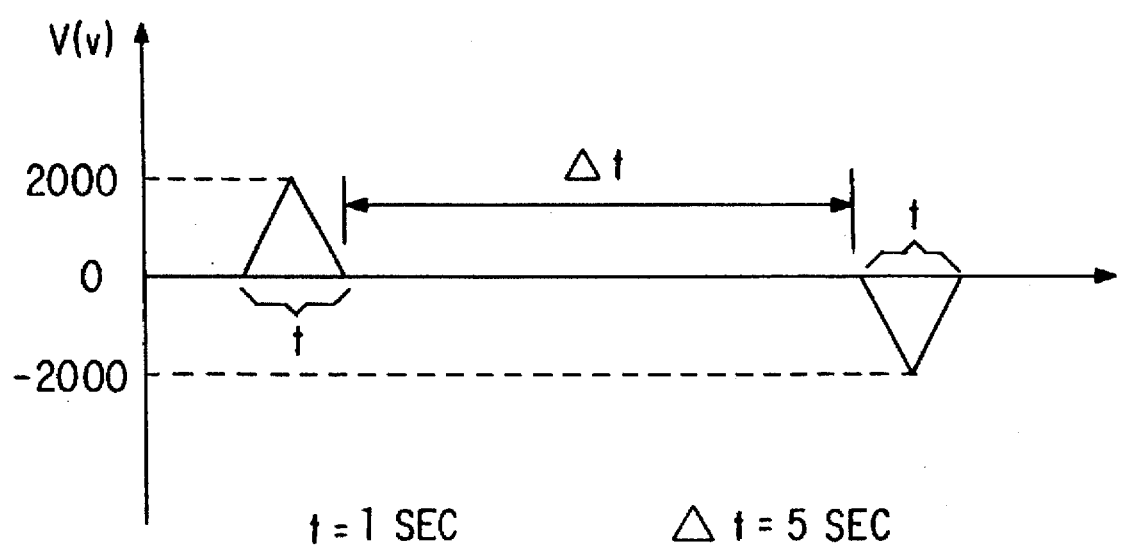
FIGS. 8(a) and (b) show plots of voltage waveforms and current amplitude for the electrochemical process.

The electrochemical process described above takes twenty-eight days during which the voltages are applied in the following manner. During the initial forty-five hours, high voltage pulses illustrated in FIG. 8(a) are applied to the bath. The applied voltage waveforms of FIG. 8(a) comprise a series of voltage pulses having amplitudes of two thousand volts and alternating polarities. Each pulse has a shape of a triangle and a duration of about one second. The time intervals between centers of the adjacent pulses is about six seconds. After the initial forty-five hours, and until the end of the process, an electrical potential of sixty volts is applied to the substrates. Every four hours the polarity of the sixty volt potential is changed. During this process, the stainless steel container is kept at a ground potential and the potential applied to the wafer alternates between positive and negative sixty volts. Throughout the process the liquid in the container is maintained at 97° C. and is continuously stirred.

Figure 8B:
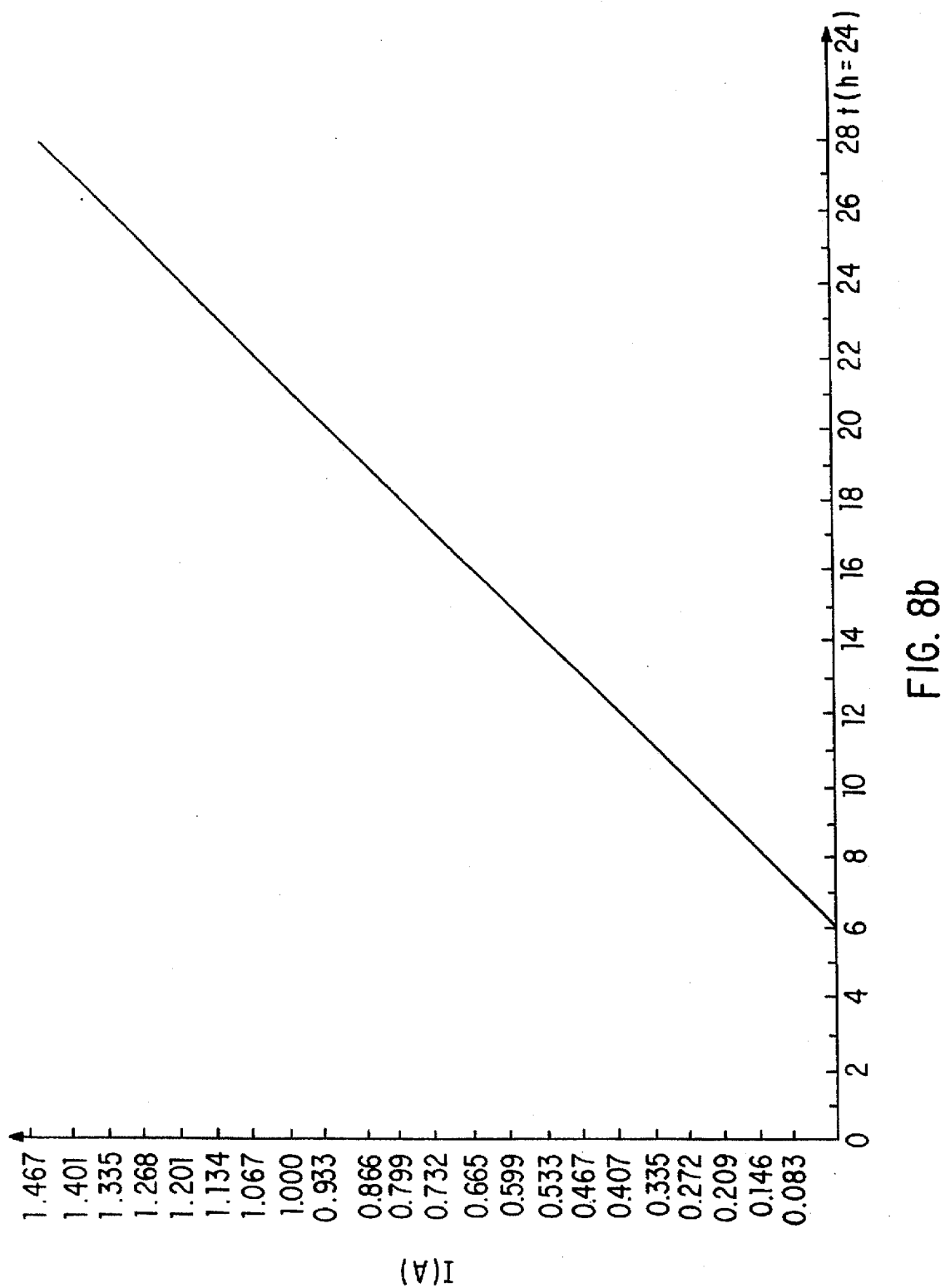

The amplitude of the current flow in the liquid is continuously monitored. FIG. 8(b) illustrates the current I (in Amperes) in the water during the entire twenty-eight days of the process for one hundred three inch wafers processed concurrently in the electrode bath. In FIG. 8(b), the days are indicated on the horizontal axis as "t" and the current is indicated on the vertical axis as "I".

At the end of the twenty-eighth day, when the current passing the liquid is about 1.5 Amperes, the electrode is disconnected from the substrates and the substrates are removed from the bath. At this point, the layers are saturated with O and a sufficient amount of Bi has been incorporated in the layered structure. Note that in a different embodiment, ion implantation techniques can also be employed for introducing these elements into the layered structure.

Subsequently, approximately 1 µm thick layers of silver are deposited onto both surfaces of the wafer to form electrodes 550 and 560 of FIG. 5(a) and (b). Thus, the structure as shown in FIG. 5 has been formed.

The wafer is then diced into 12 cm×12 cm square chips. Each surface of a chip contains two thousand and forty-eight address lines. The dimensions and spacing between the address lines are discussed above. Since each intersection of the two address lines on the opposite surfaces of the chip forms a storage cell, there are approximately four million storage cells in each chip. Since two independent bits of information can be stored in each storage cell of the chip, each 12 cm×12 cm chip is therefore capable of storing approximately eight mega bits of information.

Thus, at the completion of this procedure, a novel two-dimensional memory array has been manufactured, where the area in the vicinity of each intersection of the orthogonal address lines 510 and 520 is an individual cell of memory. The storage and retrieval of binary data in each storage cell is discussed in detail below.

Figure 5B:
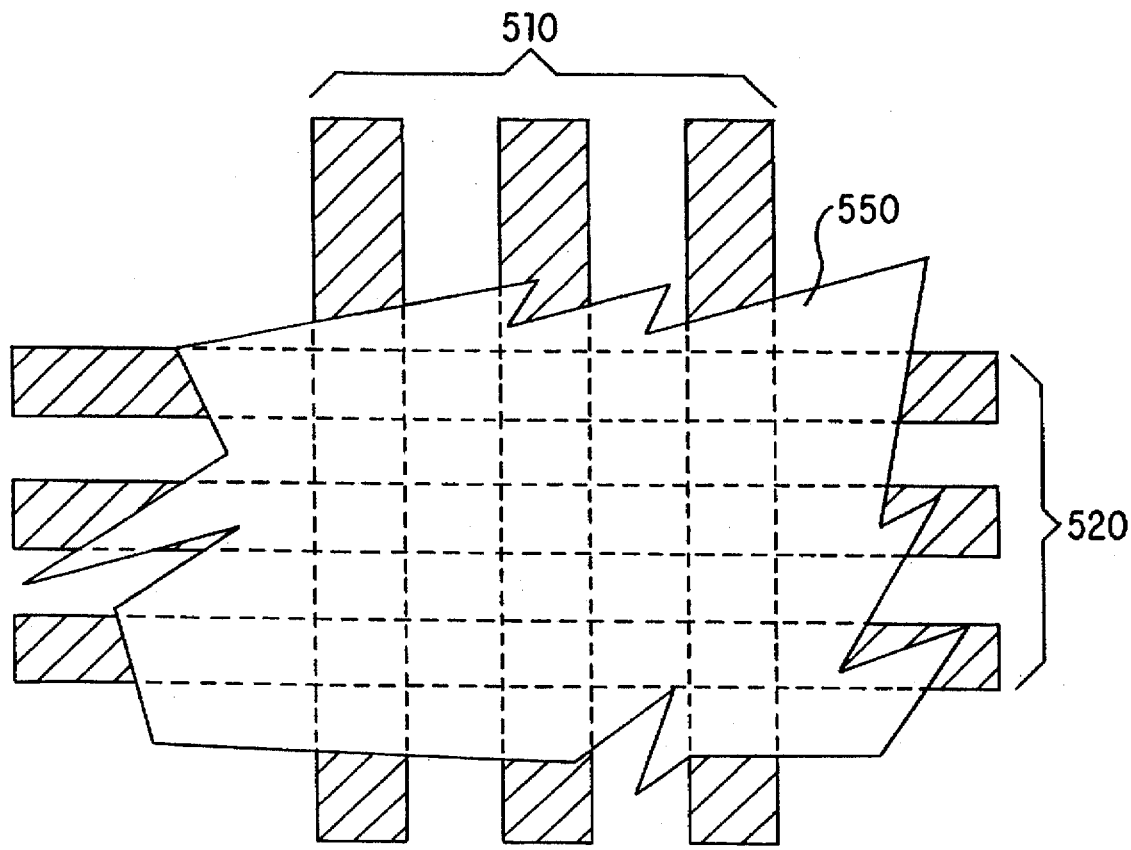

As shown in FIGS. 5(a) and 5(b), the set of metal strips on the lower surface of the Si substrate forms a first set of addressing lines 520, (referred to as X lines), and the set of metal strips on the upper surface of the substrate forms a second set of addressing lines 510, (referred to as Y lines). When two electrical currents $I_i$ and $I_j$) are simultaneously, applied to a given line $X_i$ of the X lines and a line $Y_j$ of the Y lines, respectively, a storage cell (i,j) at the intersection of $X_i$ and $Y_j$ is selected. By properly choosing the magnitudes and polarities of the currents $I_i$ and $I_j$, information can be stored or retrieved from the storage cell (i,j). Thus, the memory array, comprising the storage cells of the present invention, is random accessible.

Figure 9A:
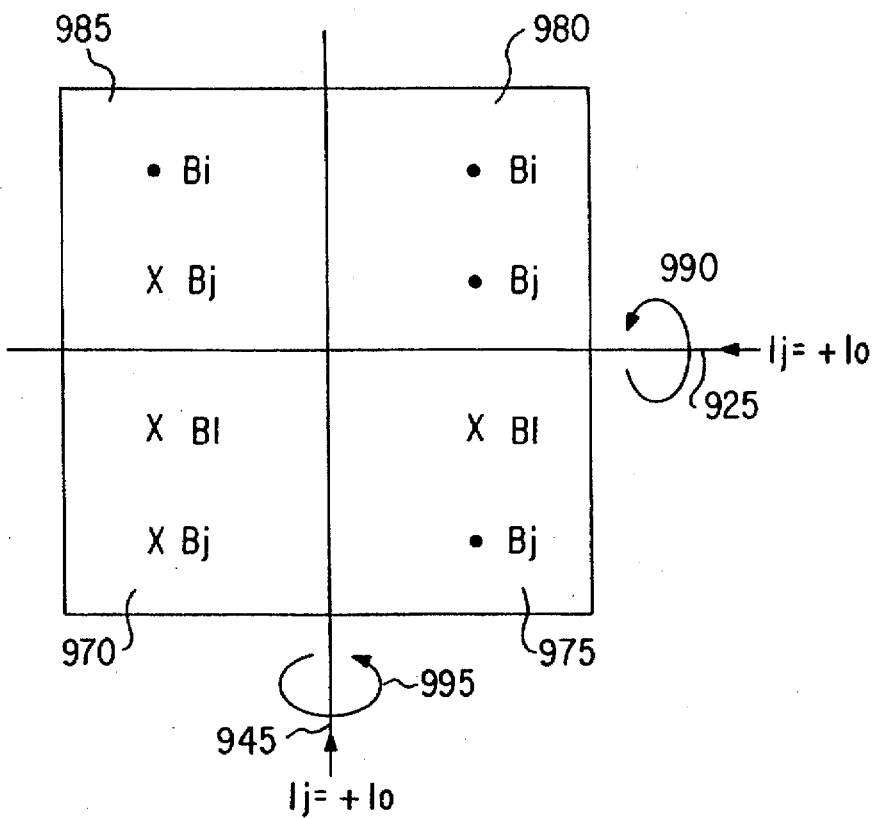
FIGS. 9(a) and (b) illustrate selecting bits of information in a memory cell.

The process of storing information in a cell will be apparent from FIGS. 9(a), 9(b), 10(a), 10(b), 11(a), 11(b), 12(a) and 12(b), 13 and 14. FIGS. 9(a) and (b) illustrate top views of a single storage cell.

As illustrated in FIG. 9(a), the orthogonal address lines 925, 945 divide the cell into four quarters 970, 975, 980 and 985. As discussed below, a first bit of information is magnetically stored in the quarters 970 and 980 and a second bit is magnetically stored in the quarters 975 and 985. For simplicity, the quarters 970 and 980 where a first bit of information is stored, are collectively referred to as carrier "a" and the quarters 975 and 985 where a second bit is stored are collectively referred to as a carrier "b".

To store a bit of information in one of the carriers of the storage cell, two electrical currents having specified amplitudes and polarities are applied to first and second address lines, 925 and 945, respectively. Information is retrieved from one of the carriers by applying two electrical currents to the address lines and measuring a piezoelectric voltage generated between the upper and lower electrodes.

The current applied to the first address line is denoted by $I_i$, and the current applied to the second address line is denoted by $I_j$. The directions of $I_i$ and $I_j$ are indicated by the arrows at the address lines. In the preferred embodiment, the currents $I_i$ and $I_j$ have the same amplitude, $I_0$. Each current generates an induced circular magnetic field around the corresponding address line as illustrated by the arrows 990 and 995.

The directions of the magnetic fields $B_i$ and $B_j$ induced by $I_i$ and $I_j$ in each quarter is illustrated in FIGS. 9(a) and (b). A dot (·) indicates that the field is in the "up" direction and a cross (x) indicates that the field is in the opposite or "down" direction.

As illustrated in FIG. 9(a), in the quarters 985 and 975 (carrier "b"), $B_i$ and $B_j$ have the opposite directions and thus cancel each other out. For this reason the currents illustrated in FIG. 9(a) do not affect the information stored in carrier "b". On the other hand, in the quarters 970 and 980 (carrier "a"), the fields $B_i$ and $B_j$ are induced in the same direction. Accordingly, these fields enhance each other and, thus, can alter the stored information.

Thus two currents having the same polarities and amplitudes applied to the address lines, affect only the magnetic state of carrier "a" and thereby select this carrier. Likewise, two negative pulses also select and can store data in carrier "a". Note also that the amplitudes of the currents that select carrier "a" do not have to be equal, as long as their combined effect does not change the magnetic state in carrier "b".

Figure 9B:
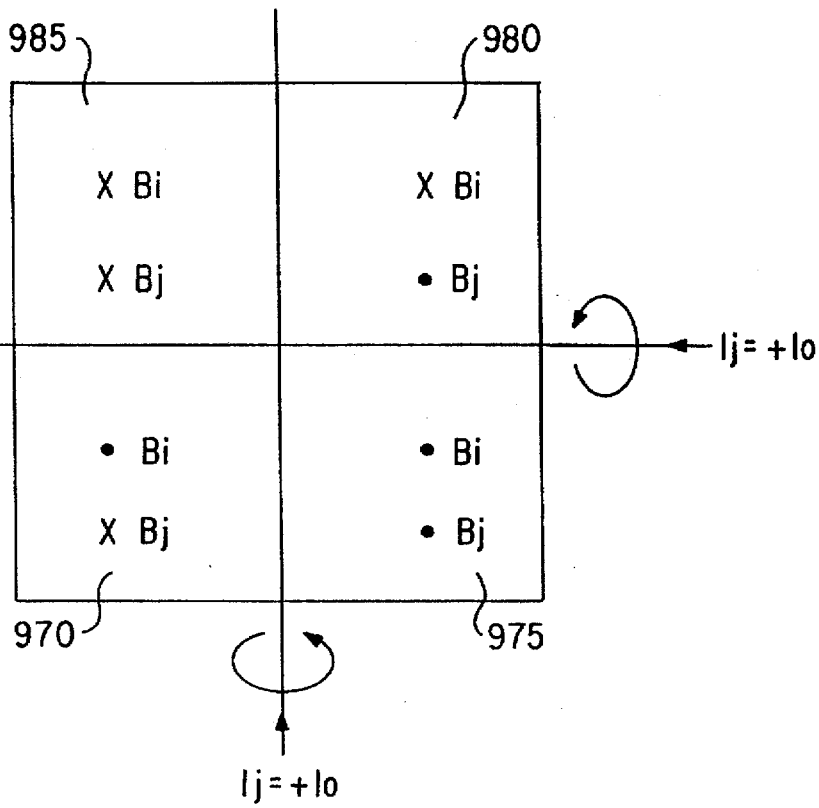

FIG. 9(b) illustrates the process of selecting carrier "b". Two currents, having opposite polarities, $I_i=+I_o$ and $I_j=-I_o$, are applied to the first and second address lines respectively. As illustrated using the dot and cross convention described above, in carrier "a", the fields generated by these currents cancel each other out, without affecting the magnetic state. In carrier "b", however, the fields generated by these currents enhance each other so that carrier "b" is selected.

Similarly, two currents $I_i=-I_o$ and $I_j=+I_o$ applied to the two address lines also select carrier "b". Thus two currents with the same amplitude but the opposite polarities select carrier "b" for storing or retrieving information.

To store information, the amplitudes of the two currents combined should also be sufficiently large to switch the magnetization of a carrier between the magnetic states $B_0$ and $-B_0$. In addition, the amplitudes of the two currents combined should be sufficiently small so that a single current alone is unable to change the magnetic state of a carrier. This is necessary to assure that only one carrier in the memory array is selected by two signals applied on two address lines.

To non-destructively retrieve the stored information, the amplitudes of the two currents combined should be small enough that the induced field is insufficient to change the magnetic state of the carrier. The combined amplitudes, however, should also be sufficient to disturb the magnetic state of the carrier so as to generate a piezoelectric voltage across the device structure. As discussed above, the direction of this piezoelectric voltage represents the binary data stored in the carrier.

Figure 10A:
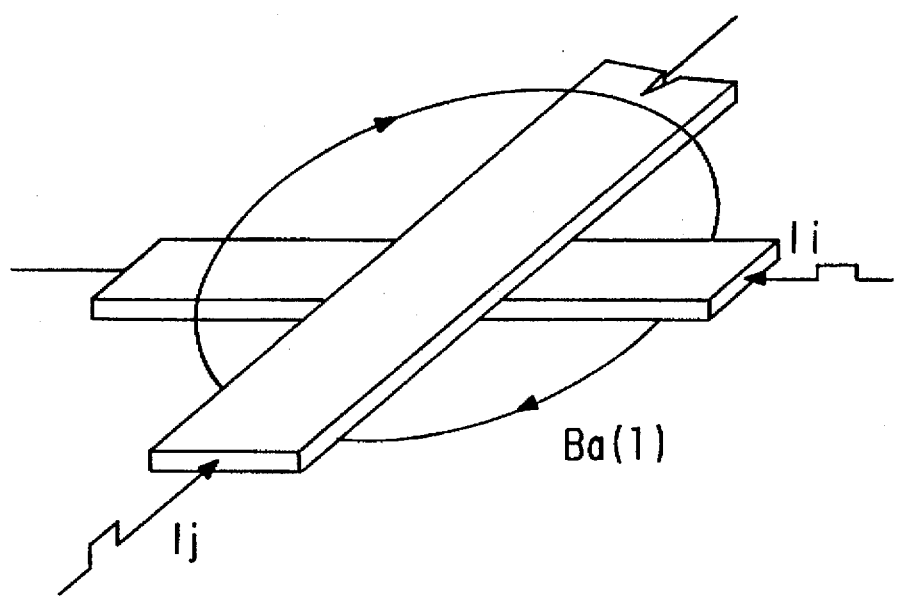
FIGS. 10(a) and (b) illustrate storing a first bit of information.

By way of illustration, FIG. 10(a) depicts the process of writing a binary "1" into carrier "a" using synchronous current pulses on the two address lines. Initially, all the cells of the array are assumed to be in the "0" state which corresponds to a magnetic induction of $-B_0$. To write a binary "1", two synchronized current pulses, $I_i$=5.0 µA and $I_j$=5.0 µA are applied to the two address lines, respectively. This generates a magnetic field H which magnetizes the compositions of materials of a memory cell. The magnetic induction $B_a$ of these layers is depicted in FIG. 10(a) as a closed loop with an arrow. For the structure of FIG. 5 having the dimensions described above, the amplitude of the critical current $I_c$ necessary to generate the critical field strength $H_c$ required for switching between the two discrete states is approximately 8.0 µA. At the cell where the two pulses coincide, the two +5.0 µA currents create a field H that would be generated by applying a 10.0 µA current. Since this current is greater than $I_c$, the magnetic induction becomes $B_0$ so that a binary "1" is stored. As explained previously, after the pulses have been applied, the magnetic induction at the cell $B_a$ remains equal to $B_0$ without requiring additional refresh or power, so that a binary "1" is retained in carrier "a".

Figure 10B:
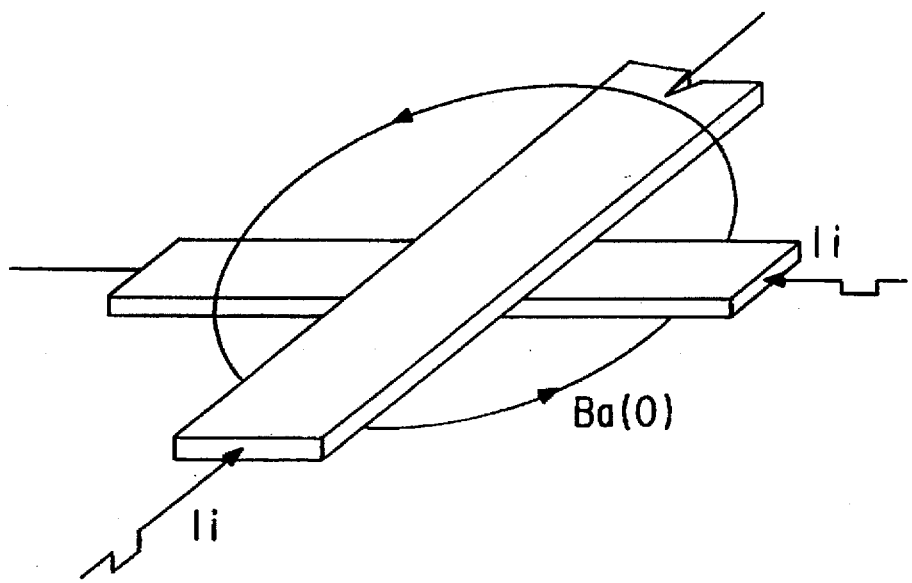

As shown in FIG. 10(b), to store a binary "0" into carrier "a", two synchronized current pulses, $I_i$=-5.0 µA and $I_j$=-5.0 µA are applied to the address lines respectively. Since the sum of these currents is -10.0 µA, which is less than $-I_c$, the current pulses switch the magnetic state from $+B_0$ to $-B_0$.

switching between $+B_0$ and $-B_0$ generates a piezoelectric voltage pulse between the first and second electrodes after a delay Δt from the time of the application of the current pulses. The piezoelectric pulse is positive for switching from $+B_0$ to $-B_0$ and is negative for switching from $-B_0$ to $+B_0$. If the magnetic state does not change, no piezoelectric pulse is generated. Accordingly, the generated piezoelectric voltage pulses can be employed to verify that a bit of binary data has been stored.

Figure 11A:
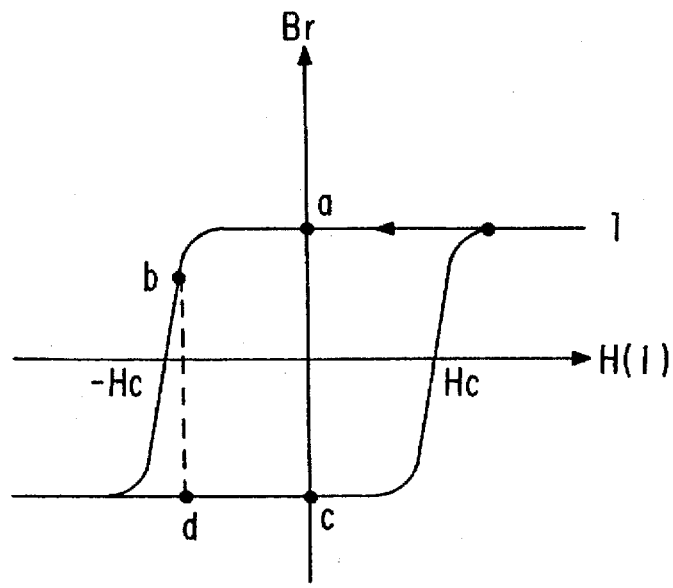
FIGS. 11(a) and (b) illustrate retrieving the first bit of information.

To non-destructively retrieve information stored in carrier "a" of the cell, two synchronized current pulses, $I_i$=3.33 µA and $I_j$=3.33 A, are applied to the address lines. Since the critical current $I_c$=-8.0 µA, the 6.66 µA sum of these currents cannot switch the magnetic states from $+B_0$ to $-B_0$. This current, however, is sufficient to disturb the magnetic state without complete switching. As shown in FIG. 11(a), assuming a binary "1" is stored in carrier, the applied current pulses change $B_a$ from a value corresponding to a point such as "a" on the magnetization curve to the value corresponding to point "b" on the curve. Because of the previously discussed piezoelectric properties of the cell, this change in the magnetic induction generates a positive piezoelectric voltage of approximately +10 µV, indicating that a "1" is stored in carrier.

If a "0" is stored in carrier "a", the applied current pulses will change $B_a$ from a value corresponding to point "c" to the value corresponding to point "d" on the curve. In this case, however, the magnetic induction of carrier "a" remains at $B_a$=$-B_0$, so that no piezoelectric voltage is generated, indicating that a "0" is stored. The information stored in the memory cell is not changed during the reading process because I is less than $I_c$.

Figure 11B:
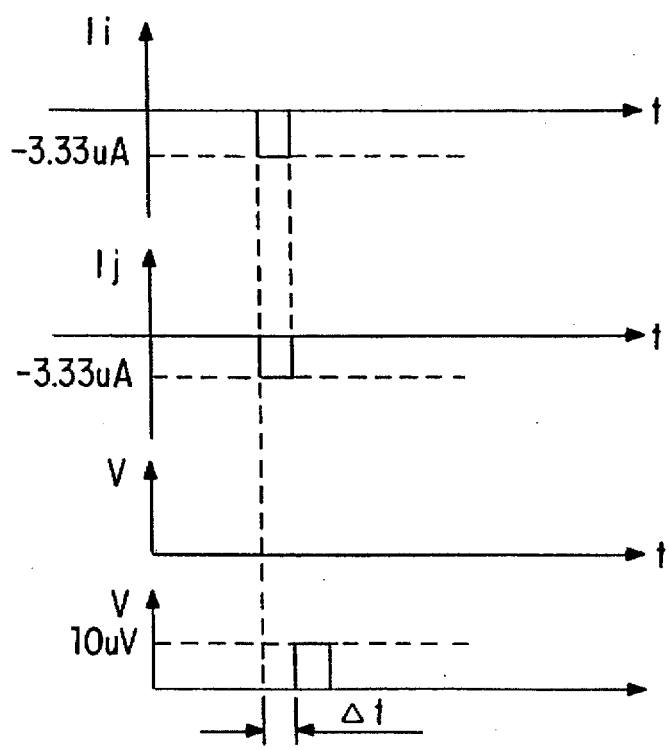

This process of non-destructively retrieving data is illustrated in the time domain in FIG. 11(b). The delay Δt between the piezoelectric voltage pulse and the input synchronized current pulses is theoretically estimated to be less than 1.0 ns. This delay measured from the chip described above is about 1–2 ns.

Figure 12A:
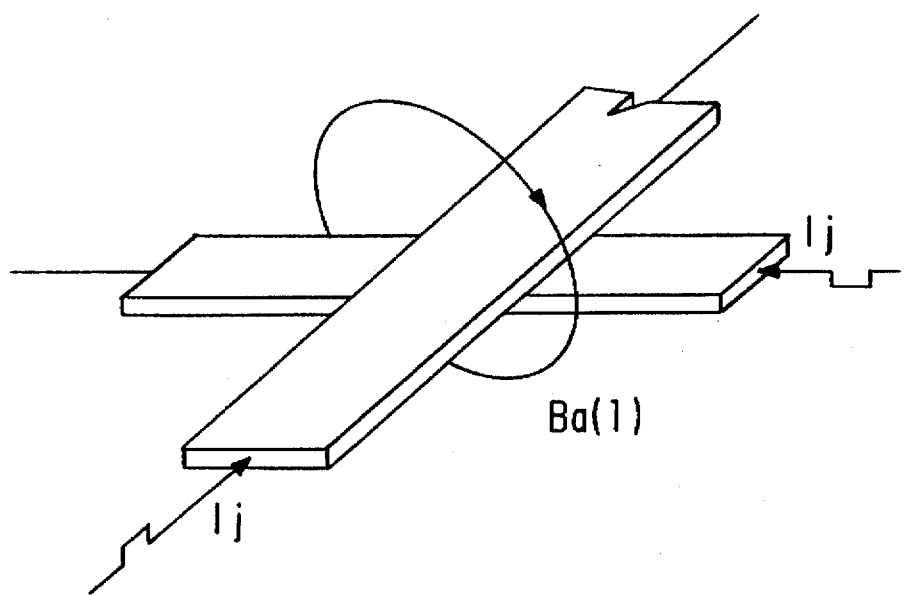
FIGS. 12(a) and (b) illustrate storing a second bit of information.
Figure 12B:
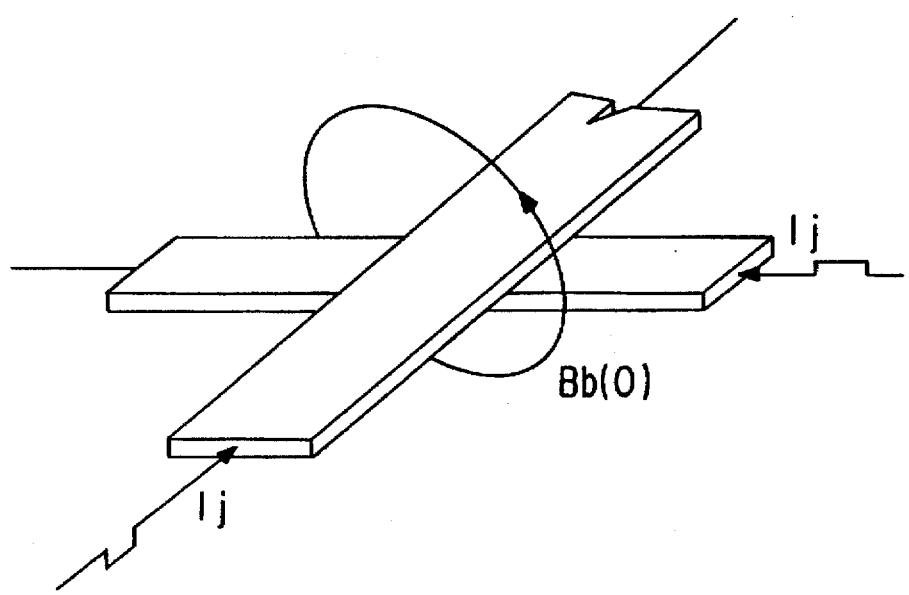

The storage and retrieval of data in carrier "b" is performed similarly. As shown in FIG. 12(a), two synchronized current pulses, $I_i$=-5.0 µA and $I_j$=+5.0 µA are applied to the address lines to store a "1" in carrier "b". As discussed above, such current pulses do not affect carrier "a". At the point where the pulses coincide, a field which is equivalent to the field induced by the 0.1 μA current is induced. Since this value is greater than $I_c=8.0$ μA, a "1" is stored in carrier "b". As shown in FIG. 12(b), the current pulses $I_i=+5.0$ μA and $I_j=-5.0$ μA are applied to store a "0" in carrier "b".

Switching from "1" to "0" in carrier "b" generates a piezoelectric voltage pulse between the electrodes at a delayed time $\Delta t$, and switching from "0" to "1" also generates a piezoelectric voltage pulse. If the state does not change, no piezoelectric voltage is generated.

Figure 13:
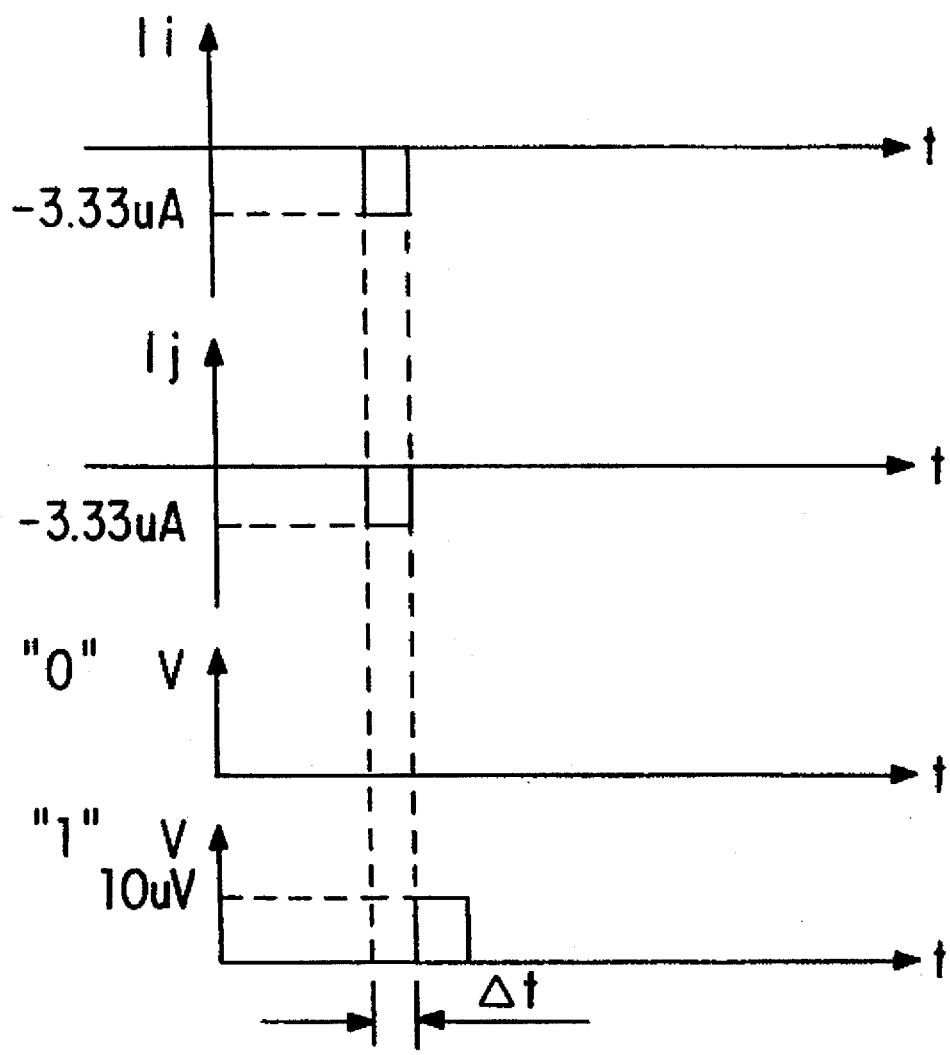
FIG. 13 illustrates the current pulses used for retrieving the second bit of information.

The data stored in carrier "b" is non-destructively retrieved in a similar fashion as discussed in conjunction with carrier "a". As shown in FIG. 13, to non-destructively retrieve data stored in carrier "b", two synchronized current pulses, $I_i=3.33$ μA and $I_j=-3.33$ μA are applied. The combined magnitudes of these pulses are not sufficiently large to switch the magnetic state in carrier "b". If a "0" is stored, the current pulses would not change the magnetic induction $B_b$ of carrier "b", and no piezoelectric voltage between the electrodes would be generated. If a "1" is stored in carrier "b", the applied current pulses would disturb the magnetic state $B_b=B_0$ but not change it, generating a positive piezoelectric voltage pulse after a delay $\Delta t$. Thus, for carrier "b", the absence of piezoelectric voltage pulse indicates that a "0" is stored, and a positive piezoelectric voltage indicates that a "1" is stored.

In the above paragraphs, a non-destructive method of retrieving data from carriers "a" and "b" has been described. Alternatively, information can also be destructively retrieved from the carriers. Recall that changing the magnetic state of a carrier generates a piezoelectric voltage between the two electrodes. This piezoelectric voltage identifies the information stored in carrier. For example, to destructively retrieve data from carrier "a", two synchronized current pulses $I_i=-5.0$ μA are applied to the two address lines respectively. These pulses write a "0" in carrier "a". If a "0" has been stored in carrier "a", these current pulses would not change the magnetic state of carrier "a" and therefore, no piezoelectric voltage will be detected between the electrodes. However, if a "1" has been stored in carrier "a", the current pulses will change the magnetic state of carrier from the state corresponding to "1" to the state corresponding to "0", thereby generating a piezoelectric voltage between the electrodes. Note that in such retrieve process, the stored information may be changed. Therefore, a restoring process to rewrite the stored information back to the carrier is normally employed after the destructive retrieving.

Figure 14:
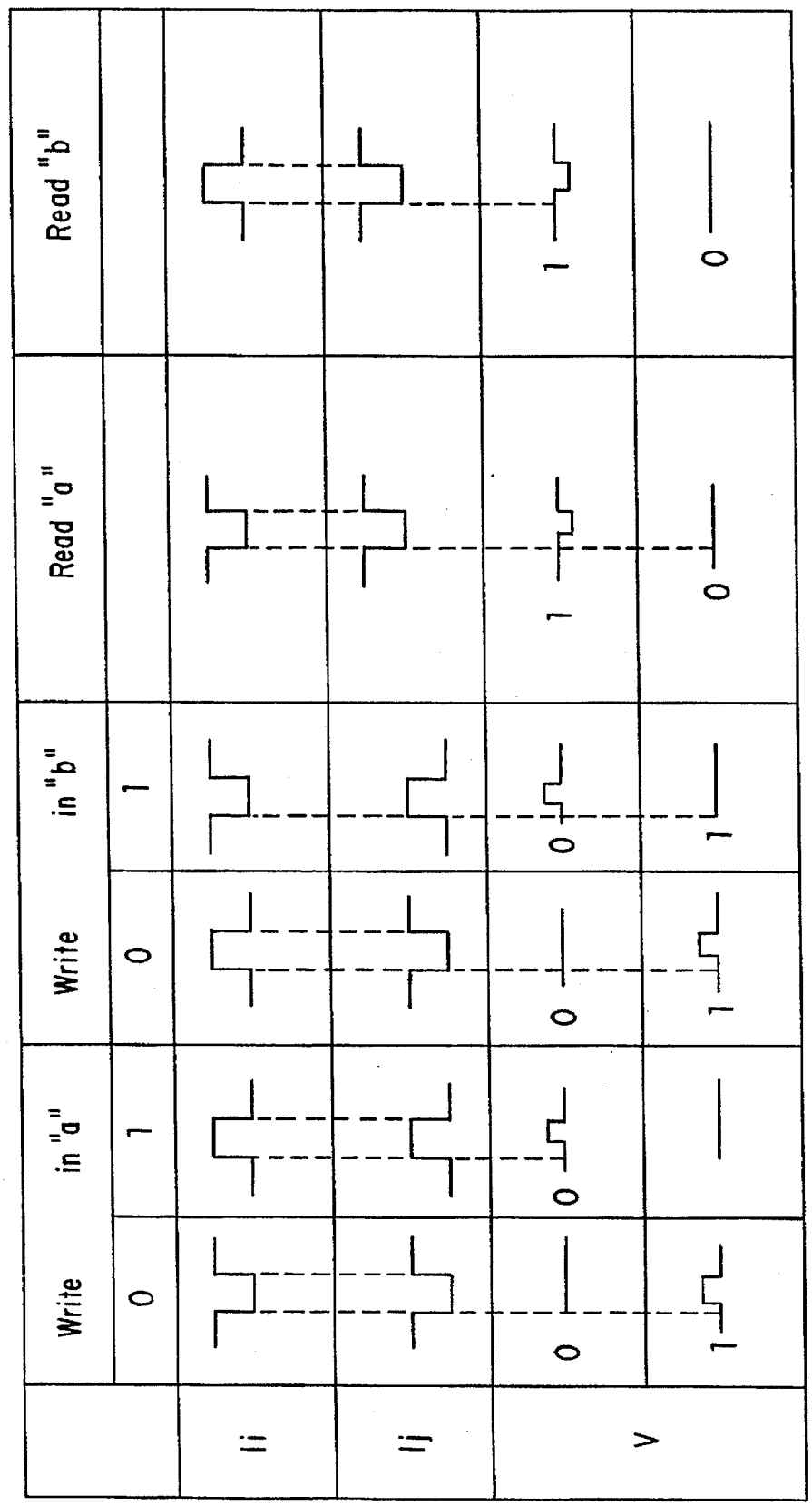
FIG. 14 symbolically summarizes the storing and retrieving information from the memory device.

FIG. 14 symbolically summarizes the above-described methods of storing and retrieving data from carriers "a" and "b" of the memory device. Note that in this figure the wave forms are shown as symbolic representations and do not depict the actual signals. Two synchronized currents $I_i=3.33$ μA and $I_j=3.33$ μA are utilized for non-destructively retrieving information from carrier "a". Similarly, two synchronized currents $I_i=-3.33$ μA and $I_j=3.33$ μA can be used to retrieve data from carrier "b". Also a method of destructive readout can be employed. For example, two synchronized current pulses $I_i=5.0$ μA and $I_j=5.0$ μA, that write a "1" in carrier "a", can be applied and the piezoelectric voltage generated in response to these pulses would identify the previously stored data, thereby destructively retrieving data from carrier "a".

Another property of the memory of this invention is that a sufficient voltage applied between the two electrodes prevents storing information in this memory. This property can be utilized to selectively store information in a memory when several memory chips are employed concurrently in the same storage device. The voltages sufficient to prevent storing information in the memory of the invention is approximately 200 μV. When this voltage is applied to the electrodes, the application of currents to the address lines does not change the stored information.

One of the advantages of the memory device of the present invention is its low power consumption in comparison with the prior art non-volatile magnetic memory devices. Since the storage media employed in this device is highly sensitive to the magnetic field generated by the driving currents, it can quickly store binary values at relatively small driving currents, about 5.0 μA on each line. Consequently, the power consumption is low for storing and retrieving data.

Note also that the retrieval of information as a piezoelectric voltage generated between the electrode is intrinsically faster than generating induced electromagnetic voltage as it was done in prior art magnetic memory devices.

Typically, the delay between the current pulses and corresponding piezoelectric voltage is in the range of subnanoseconds. Switching between a "1" and a "0" usually takes a few nanoseconds.

Thus a memory device which is random accessible, non-volatile, and operates in static mode has been described. This memory device offers high-speed operation, low power consumption, and storage of information at high density.

The claims which follow are to be interpreted to cover all the equivalent structures and methods. The invention is, thus, not to be limited by the above exemplary disclosure, but only by the following claims.

What is claimed is:

1. A non-volatile, random-accessible memory device comprising:

a substrate having first and second surfaces;

a first address line formed on the first surface of the substrate;

a second address line formed on the second surface of the substrate;

a first composition of materials formed on the first surface of the substrate, the first composition of materials having ferromagnetic and piezoelectric properties and comprising the elements of Pb, Cd, Fe, Cr, Zn and an element selected from a group consisting of Te and Tl; and a second composition of materials formed on the second surface of the substrate, the second composition of materials having ferromagnetic and piezoelectric properties and comprising the elements of Pb, Cd, Fe, Cr, Zn and an element selected from a group consisting of Te and Tl, the first and the second compositions of materials comprising a first layer of material formed on the substrate and a second layer of material formed on the first layer, the first layer of material comprising the elements of Pb, Cd, and Fe, wherein the ratio between Pb, Cd, and Fe in the first layer is (1−x−y):x:y where the values of (1−x−y), x and y are within the ranges of $0 \leq (1-x-y) \leq 1$, $0 \leq x \leq 1$, and $0 \leq y \leq 1$, and the second layer of material comprising elements of Cr, Zn, and R where R is an element selected from the group consisting of Te and Tl, wherein the ratio between Cr, Zn and R in the second layer is (1−z−w):z:w where the values of (1−z− w), z and w are within the ranges of $0 \leq (1-z-w) \leq 1$, $0 \leq z \leq 1$, and $0 \leq w \leq 1$.

2. The device of claim 1 wherein the first and second layers further comprises an element selected from the group consisting of S and Se.

3. The device of claim 2 wherein the first and second layers further comprise the element O.

4. The device of claim 3 wherein the first and second layers further comprise the element Bi.

5. The device of claim 4 wherein x, y, z, and w are values within the ranges of $0.038 \leq x \leq 0.042$, $0.08 \leq y \leq 0.94$, $0.34 \leq z \leq 0.45$, and $0.25 \leq w \leq 0.34$.

6. The device of claim 5 wherein z, w, and (1−z−w) are values within the ranges of $0.38 \leq z \leq 0.41$, $0.28 \leq w \leq 0.31$, and $0.25 \leq (1-z-w) \leq 0.32$.

7. The device of claim 6 wherein the value of x is substantially 0.04, the value of y is substantially 0.09, the value of z is substantially 0.40, and the value of w is substantially 0.30.

8. The device of claim 1 wherein the substrate is a silicon substrate.

9. The device of claim 1 wherein the first and second address lines are made of a conductive material.

10. The device of claim 9 wherein the conductive material comprises silver.

11. The device of claim 9 wherein the address lines are metal strips substantially 1 µm wide and substantially 1 µm thick.

12. The device of claim 1 wherein the second address line is substantially orthogonal to the first address line.

13. The device of claim 1 further comprising:

a first electrode formed on the outer surface of the first composition of materials; and a second electrode formed on the outer surface of the second composition of materials.

* * * * *